United States Patent
Kang et al.

(10) Patent No.: US 7,639,524 B2
(45) Date of Patent: Dec. 29, 2009

(54) MULTI-BIT NONVOLATILE MEMORY DEVICES AND METHODS OF OPERATING THE SAME

(75) Inventors: Dong-Hun Kang, Yongin-si (KR); Jeong-Hee Han, Suwon-si (KR); Wan-Jun Park, Seoul (KR); Won-Joo Kim, Suwon-si (KR); Jae-Woong Hyun, Uijeongbu-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 515 days.

(21) Appl. No.: 11/335,618

(22) Filed: Jan. 20, 2006

(65) Prior Publication Data
US 2009/0285030 A1 Nov. 19, 2009

(30) Foreign Application Priority Data
Jan. 26, 2005 (KR) .................... 10-2005-0007240

(51) Int. Cl.
G11C 11/34 (2006.01)
(52) U.S. Cl. ............. 365/151; 365/185.03; 365/185.28; 977/938; 977/943
(58) Field of Classification Search ............ 365/151, 365/185.03, 185.24, 185.28; 977/938, 943
See application file for complete search history.

(56) References Cited

U.S. PATENT DOCUMENTS

| | | | |
|---|---|---|---|
| 6,798,000 B2 * | 9/2004 | Luyken et al. ............. 257/213 |
| 6,944,047 B2 * | 9/2005 | Rotenberg et al. .......... 365/151 |
| 6,946,703 B2 * | 9/2005 | Ryu et al. ................... 257/315 |
| 7,015,500 B2 * | 3/2006 | Choi et al. .................. 257/40 |
| 7,157,773 B2 * | 1/2007 | Kato et al. .................. 257/347 |
| 7,180,107 B2 * | 2/2007 | Appenzeller et al. ........ 257/288 |
| 2005/0286293 A1 | 12/2005 | Furukawa et al. |

FOREIGN PATENT DOCUMENTS

CN 1716608 A 1/2006

OTHER PUBLICATIONS

Chen et al. "Nonvolatile Flash Memory Device Using Ge Nanocrystals Embedded in HfAIO High-k Tunneling and Control Oxides: Device Fabrication and Electrical Performance," Nov. 2004. IEEE Transactions on Electron Devices, vol. 51, No. 11. pp. 1840-1848.*
Martel et al. "Single- and Multi-wall Carbon Nanotube Field-Effect Transistors," Oct. 1998. Applied Physics Letters vol. 73, No. 17. pp. 2447-2449.*
Chinese First Office Action dated Jul. 4, 2008, for corresponding Chinese Patent Application No. 2006100048716.

* cited by examiner

*Primary Examiner*—Tuan T Nguyen
*Assistant Examiner*—Alexander Sofocleous
(74) *Attorney, Agent, or Firm*—Harness, Dickey & Pierce, P.L.C.

(57) ABSTRACT

A memory device may include a channel including at least one carbon nanotube. A source and a drain may be arranged at opposing ends of the channel and may contact different parts of the channel. A first storage node may be formed under the channel, and a second storage node may be formed on the channel. A first gate electrode may be formed under the first storage node and a second gate electrode may be formed on the second storage node.

32 Claims, 4 Drawing Sheets

MULTI-BIT NONVOLATILE MEMORY DEVICES AND METHODS OF OPERATING THE SAME

PRIORITY STATEMENT

This application claims priority under 35 U.S.C. § 119 to Korean Patent Application No. 10-2005-0007240, filed on Jan. 26, 2005, in the Korean Intellectual Property Office (KIPO), the entire contents of which are incorporated herein by reference.

BACKGROUND

1. Field of the Invention

Example embodiments of the present invention relate to semiconductor memory devices and a methods of operating the same, for example, multi-bit nonvolatile memory devices including at least one carbon nanotube channel and methods of operating the same.

2. Description of the Related Art

Semiconductor memory devices may volatile or nonvolatile memory devices. Volatile memories, such as DRAMs or the like may be used to store data in a hard disc and/or process data more rapidly when a computer is turned on. Volatile memories may be included in electronic equipment, such as computers or the like.

Non-volatile memories, in addition to being usable in computers, may also be used in mobile phones, digital cameras, and the like. Non-volatile memories may have higher processing speeds and/or may store data even when the power is turned off.

Nonvolatile memory devices may use the transition of a threshold voltage of a transistor, charge displacement or a change in resistance for recording and/or erasing data. Nonvolatile memory devices using the threshold voltage transition of a transistor may include, for example, flash memory devices using a floating gate as a storage node, SONOS memory devices using a charge trap as a storage node, or the like. A non-volatile memory device using charge displacement may be, for example, a ferroelectric memory (FRAM) including a nano-crystal or a polymer. Non-volatile memory devices using resistance variation may include a magnetic random access memory (MRAM), phase-change random access memory (PRAM), resistance random access memory (RRAM) or a polymer memory. These nonvolatile memory devices may have lower integration density and/or lower capacity, which may result from limits of manufacturing process therefore.

In related art memory devices, channels may be formed by doping a semiconductor substrate formed of silicon with a dopant. A planar memory device may be formed on the semiconductor substrate on which the channel is formed. However, a three dimensional structure memory device for a multi-bit operation may not be formed.

SUMMARY OF THE INVENTION

Example embodiments of the present invention provide multi-bit nonvolatile memory devices, which may include a channel formed of at least one carbon nanotube. Example embodiments of the present invention also provide methods of operating multi-bit nonvolatile memory devices.

In a memory device, according to an example embodiment of the present invention, a channel may be formed of at least one carbon nanotube. A source and a drain may be arranged at respective ends of the channel. The source and drain may contact at least a portion of a respective end of the channel. A first storage node may be formed under the channel and a second storage node may be formed on the channel. A first gate electrode may be formed under the first storage node and a second gate electrode may be formed on the second storage node.

In example embodiments of the present invention, at least one of the first and second storage nodes may have a stack structure, may be formed of embedded nano-crystals, polymers and/or biomaterials. For example, the stack structure may include at least one silicon oxide film and at least one silicon nitride film stacked alternately, two silicon oxide films with a silicon nitride film interposed therebetween or a silicon oxide film, a high K insulating film having a larger dielectric constant than the silicon oxide film and a silicon oxide film stacked alternately. The nano-crystals may be formed of metal dots or silicon dots. The source and the drain may be formed of a metal or metal alloy. The metal may include at least Au.

In example embodiments of the present invention, the first gate electrode may be formed of silicon doped with a dopant. The dopant may be a p-type dopant.

In example embodiments of the present invention, the channel may be formed of a single-walled carbon nanotube, a double-walled carbon nanotube, a plurality of carbon nanotubes in parallel, or a bundle of a plurality of carbon nanotubes. The plurality of carbon nanotubes may be single-walled, double-walled, or a combination thereof.

A cell array, according to an example embodiment of the present invention, may include a plurality of cell units. Each cell unit may include a memory device. In at least one of the memory devices, a memory device, a channel may be formed of at least one carbon nanotube. A source and a drain may be arranged at respective ends of the channel. The source and drain may contact at least a portion of a respective end of the channel. A first storage node may be formed under the channel and a second storage node may be formed on the channel. A first gate electrode may be formed under the first storage node and a second gate electrode may be formed on the second storage node.

In a method of operating a memory device, according to an example embodiment of the present invention, at least one of a writing operation, an erasing operation and a reading operation may be performed. The writing operation may be performed by applying a write voltage to one of the gate electrodes after grounding the source and the drain. The erasing operation may be performed by applying an erase voltage to one of the gate electrodes after grounding the source and the drain. The reading operation may be performed by applying a first read voltage between the source and the drain while applying a second read voltage to one of the gate electrodes.

In example embodiments of the present invention, the write voltage applied to at least one of the first and second gate electrode may be a negative voltage or a sweeping voltage that sweeps from a positive voltage to a negative voltage, for example, the write voltage may be about −15V or a sweeping voltage that sweeps from about 15V to about −15V.

In example embodiments of the present invention, the erase voltage applied to at least one of the first and second gate electrode may be a positive voltage, for example, about 15V or a negative voltage, for example, about −15V.

In example embodiments of the present invention, a second read voltage applied to the first gate electrode may be a negative voltage, for example, −2V. The second read voltage applied to the second gate electrode may be a positive voltage, for example, about 10V. The first read voltage may be about 300 mV.

BRIEF DESCRIPTION OF THE DRAWINGS

The present invention will become more apparent by describing in detail example embodiments thereof as illustrated in the attached drawings in which.

DETAILED DESCRIPTION OF EXAMPLE EMBODIMENTS OF THE PRESENT INVENTION

Figure 1:
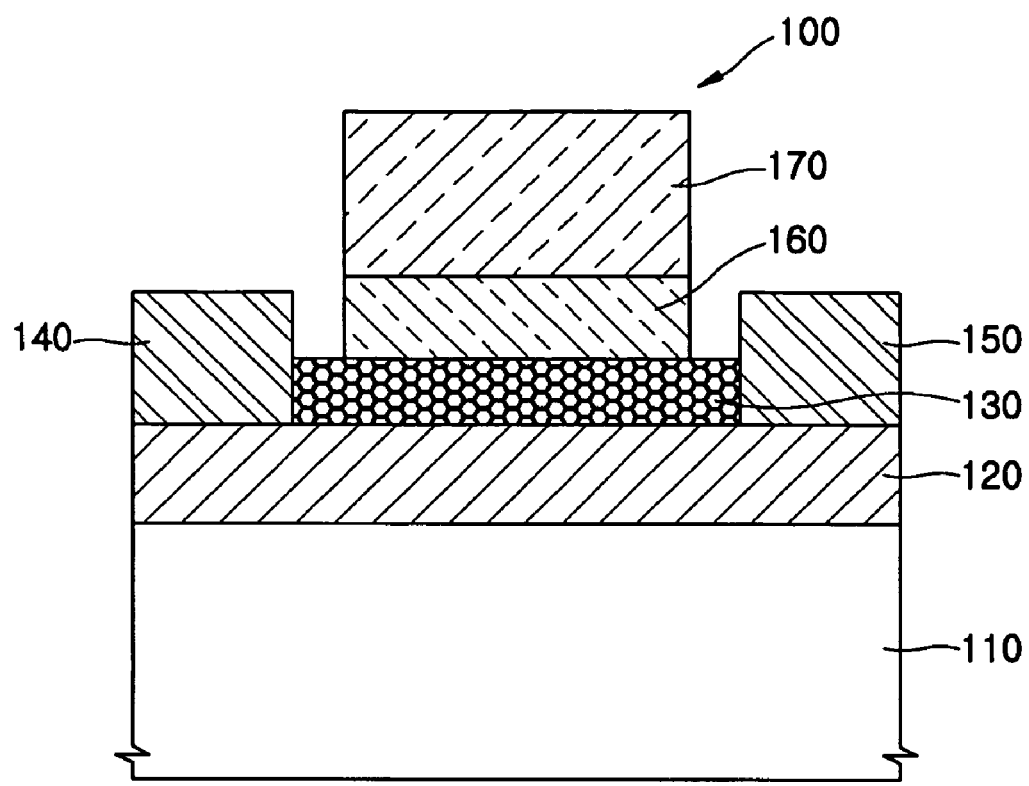
FIG. 1 is a cross-sectional view illustrating a multi-bit nonvolatile memory device according to an example embodiment of the present invention.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a cross-sectional view illustrating a multi-bit nonvolatile memory device according to an example embodiment of the present invention. As shown, a nonvolatile memory device 100 may include a pair of storage nodes 120 and 160. In at least one example embodiment, the first storage node 120 may be arranged under a channel 130, and the second storage node 160 may be stacked on the channel 130.

A lower gate electrode 110 may be disposed under the first storage node 120 and an upper gate electrode 170 may be disposed on the second storage node 160. The first storage node 120 may be a lower storage node the second storage node 160 may be an upper storage node.

The storage nodes 120 and 160 and corresponding gate electrodes 110 and 170 may share a source 140, a drain 150 and the channel 130. As noted above, the channel 130 may be interposed between the two storage nodes 120 and 160.

In at least one example embodiment of the present invention, the channel 130 may be formed of at least one carbon nanotube extending in a direction. As illustrated in FIG. 1, a carbon nanotube may have a hexagonal tubular structure, which is well known to those of ordinary skill in the art. However, the carbon nanotube may have any suitable structure.

The channel 130 may be formed of, for example, one or more single-walled carbon nanotube. However, in one or more example embodiments of the present invention, the material for the channel 130 is not limited to single-walled carbon nanotubes, but may instead be formed using double-walled structures. The single or double-walled structures of carbon nanotubes are well known to those of ordinary skill in the art.

In another example, the channel 130 may include a plurality of carbon nanotubes. The carbon nanotubes may be arranged, for example, in parallel on a single plane, as multilayers of bundles or any other suitable manner. The bundles may have various shapes, for example, a linear structure, a spiral structure, etc.

Each of the storage nodes 120 and 160 may be a single layer, for example, a silicon oxide film, a silicon nitride film, a stack layer of a silicon oxide film and a silicon nitride film or any other oxide film or stacked oxide film with similar or substantially similar properties.

In at least one example embodiment of the present invention, each of the storage nodes 120 and 160 may be a stacked layer including a silicon oxide film and a silicon nitride film. For example, each of the storage nodes 120 and 160 may have an ONO structure including a silicon oxide film, a silicon nitride film, and a silicon oxide film. In at least one other example embodiment of the present invention, each of the storage nodes 120 and 160 may have a stacked structure including a silicon oxide film, a higher K insulating film and a silicon oxide film. The higher K insulating film may be formed of a metal oxide, such as tantalum oxide, hafnium oxide, aluminum oxide, zirconium oxide and/or may have a larger dielectric constant than the silicon oxide film.

In at least one other example embodiment of the present invention, each of the storage nodes 120 and 160 may be formed of embedded nano-crystals, polymers or bio-materials. The embedded non-crystals may be formed of metal areas (e.g., metal dots), silicon areas (e.g., silicon dots), or the like.

Although discussed separately, storage nodes 120 and 160 may be formed of a combination of any of the above described structures. For example, the storage node 120 may be formed of nano-crystals and the storage node 160 may be formed of polymers.

The source 140 and the drain 150 may be formed to contact each side or opposing ends of the channel 130. The source 140 and the drain 150 need not fully contact each side of the channel 130, but may be formed to contact at least a portion of the sides of the channel 130. The source 130 and the drain 150 may be formed of a metal or metal alloy, such as Au or the like. Further, each of the source 140 and the drain 150 may be formed of a composite layer of Ti and Au, or any other similar layer or composite layer having similar electro-mechanical properties.

The lower gate electrode 110 may be formed of, for example, doped silicon. In at least one example embodiment of the present invention, the doped silicon may be doped with a dopant, such as, a p-type dopant, and the lower gate electrode 110 may be formed of a p-type silicon wafer. Although discussed with regard to a p-type dopant, the dopant may be an n-type dopant. The upper gate electrode 170 may be formed of, for example, doped polysilicon, a metal, a composite of metal and doped polysilicon or any other metallic or semi-metallic material or composite material with similar or substantially similar properties.

Figure 2:
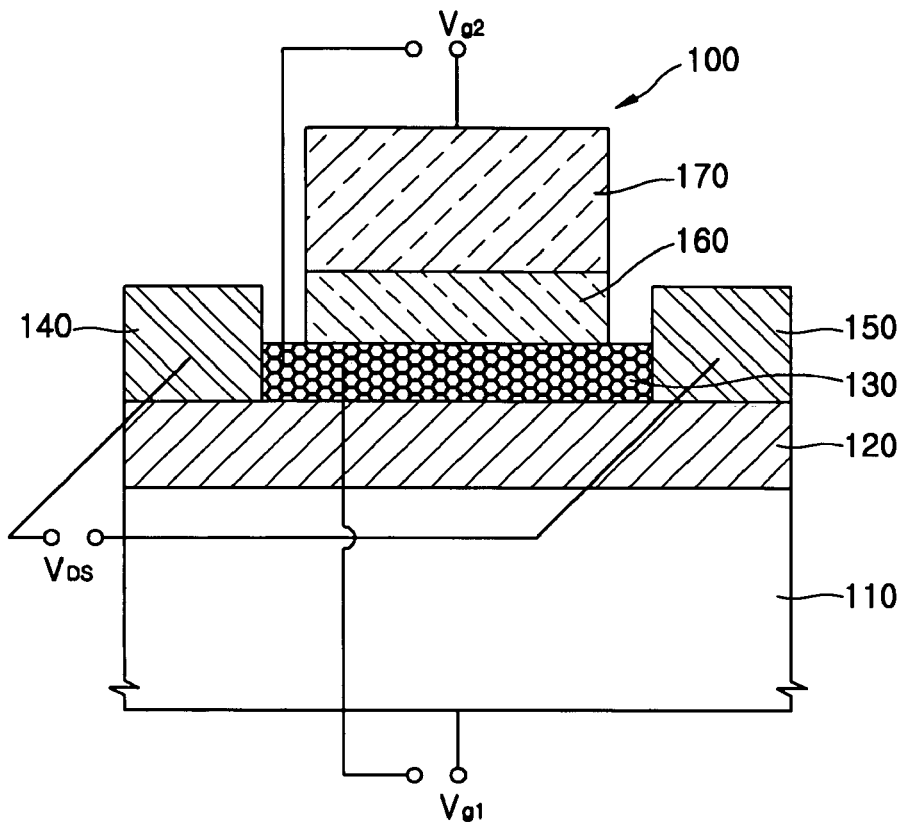
FIG. 2 is a schematic drawing showing terminal connections of a multi-bit nonvolatile memory device according to an example embodiment of the present invention.

FIG. 2 is a schematic view illustrating terminal connections of a multi-bit nonvolatile memory device according to an example embodiment of the present invention. FIG. 2 will be discussed with regard to the multi-bit nonvolatile memory device 100 of FIG. 1.

Referring to FIG. 2, a first gate voltage $V_{g1}$ is may be applied between the lower gate electrode 110 and the channel 130, and a second gate voltage $V_{g2}$ is may be applied between the upper gate electrode 170 and the channel 130. In this example, the gate electrodes 110 and 170 may share the channel 130.

The first gate voltage $V_{g1}$ may control the first storage node 120 to operate with one or more bits, and the second gate voltage $V_{g2}$ may control the storage nodes 120 and 160 to operate with one or more bits. This may enable a multi-bit operation with at least two bits because the storage nodes 120 and 160 may operate independently.

A source-drain voltage $V_{DS}$ may be applied between the source 140 and the drain 150. A voltage difference may occur between ends of the channel 130, and the channel 130 may be turned on based on application of the gate voltages $V_{g1}$ and $V_{g2}$. For example, whether the channel 130 is turned on may be determined based on whether the gate voltages are applied or not.

Figure 3:
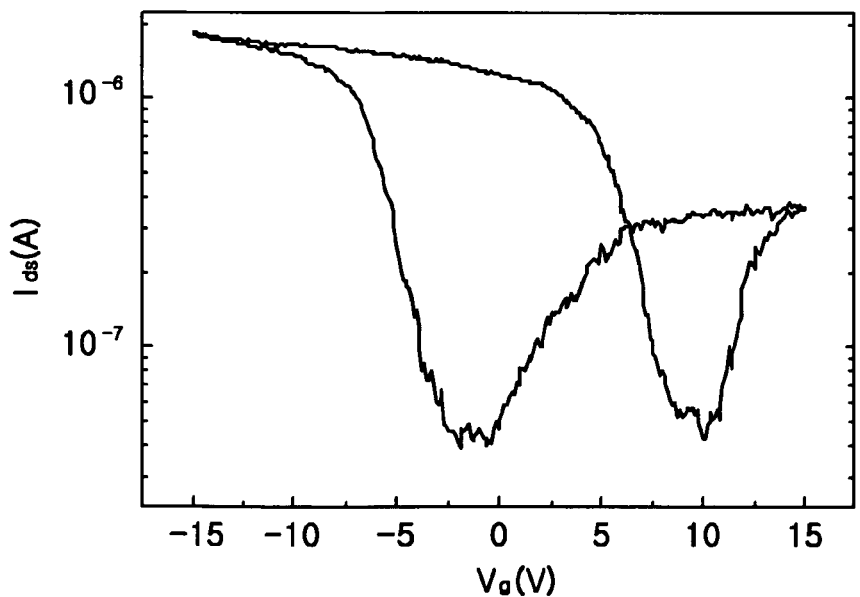
FIG. 3 is a graph of a voltage-current characteristic illustrating example writing and erasing operations of a multi-bit nonvolatile memory device according to one or more example embodiments of the present invention.

FIG. 3 is a graph of voltage-current characteristics illustrating an operation of a multi-bit nonvolatile memory device according to an example embodiment of the present invention. FIG. 3 will be discussed with regard to the multi-bit nonvolatile memory device 100 of FIG. 1.

Referring to FIG. 3, as the gate voltage $V_g$ increases to a positive value, reduces to a negative value, and returns to 0, the current $I_{ds}$ shows a hysteresis characteristic. This voltage-current hysteresis characteristic may occur when the channel 130 is formed of, for example, one or more carbon nanotubes.

The voltage-current hysteresis characteristic may be used in an operation of the upper gate electrode 170 and/or an operation of the lower gate electrode 110, wherein the upper gate electrode 170 and the lower gate electrode 110 share the channel 130. As shown in FIG. 3, $I_{ds}$ represents the current flowing between the source 140 and the drain 150, and $V_g$ represents $V_{g1}$ or $V_{g2}$ in FIG. 2.

As $V_g$ increases to a positive voltage, $I_{ds}$ increases, for example, gradually until $I_{ds}$ reaches a saturation value. After reaching the saturation value, as $V_g$ decreases, $I_{ds}$ may decrease, for example, rapidly. At about 10V, $I_{ds}$ may increase again. As $V_g$ decreases, for example, continuously to a negative voltage, $I_{ds}$ may again reach a saturation value. As $V_g$ increases again, $I_{ds}$ may decrease and, at about −2V, $I_{ds}$ may again increase.

In this example, as $V_g$ changes from 0V to 15V, from 15V to −15V, and from −15V to 0V, $I_{ds}$ may increase and decrease repeatedly. This may result in the voltage-current hysteresis characteristic.

A memory operation using the voltage-current hysteresis characteristic will now be described with reference to FIGS. 4 through 6.

Figure 4:
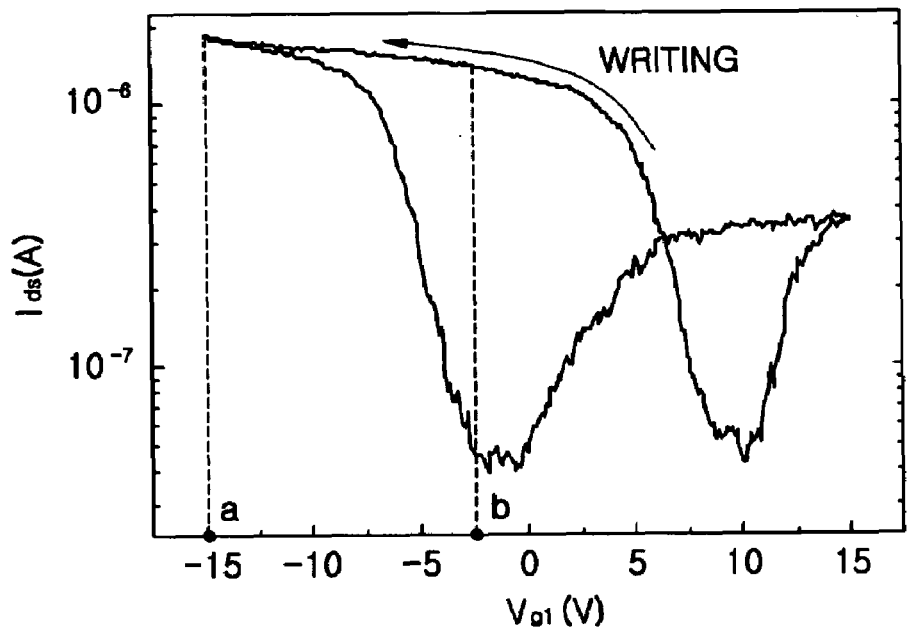
FIG. 4 is a graph of a voltage-current characteristic illustrating example writing and erasing operations of a lower gate electrode of a multi-bit nonvolatile memory device according to one or more example embodiments of the present invention.

FIG. 4 is a graph of a voltage-current characteristic for illustrating example writing and erasing operations of a lower gate electrode using a first storage node of a multi-bit nonvolatile memory device according to an example embodiment of the present invention. For example purposes, FIG. 4 will be described with reference to the first storage node 120 of FIG. 1.

Referring to FIG. 4, a writing operation may be performed using F-N tunneling between the first storage node 120 and the channel 130. For example, a zero voltage may be applied to $V_{DS}$ of FIG. 2 in order to ground the source 140 and the drain 150. A write voltage may be applied to $V_{g1}$ to perform the writing operation.

The write voltage may be a negative voltage or a sweeping voltage that may sweep from a positive voltage to a negative voltage. For example, the write voltage may be a saturated negative voltage "a". Write voltage "a" may be equal to, for example, −15V. The write voltage may be a pulse voltage. In another example, the write voltage may be a sweeping voltage that may sweep from 15V to −15V.

To perform an erasing operation, a zero voltage may be applied to $V_{DS}$ in order to ground the source 140 and the drain 150. An erase voltage (e.g., a negative and/or pulse voltage) may be applied to $V_{g1}$ to perform an erase operation. For example, the erase voltage may be a negative saturated current voltage equal to about −15V.

To perform a reading operation, a first read voltage may be applied to $V_{DS}$ and a second read voltage may be applied to $V_{g1}$. The first read voltage may be a positive voltage that may induce an appropriate voltage difference between the source 140 and the drain 150. The level of the first read voltage may be determined by those skilled in the art. For example, the first read voltage may be about 300 mV.

The second read voltage may be a voltage distinguishing a writing state from an erasing state. In one or more example embodiments of the present invention, the second read voltage must be a voltage distinguishing a writing state from an erasing state. A voltage "b" at which the current difference between the writing state and the erasing state is larger (e.g., largest) may be the second read voltage. For example, the second read voltage may be about −2V.

The upper gate electrode 170 may be in a floating state while the lower gate electrode 110 performs writing, erasing, and reading operations.

Figure 5:
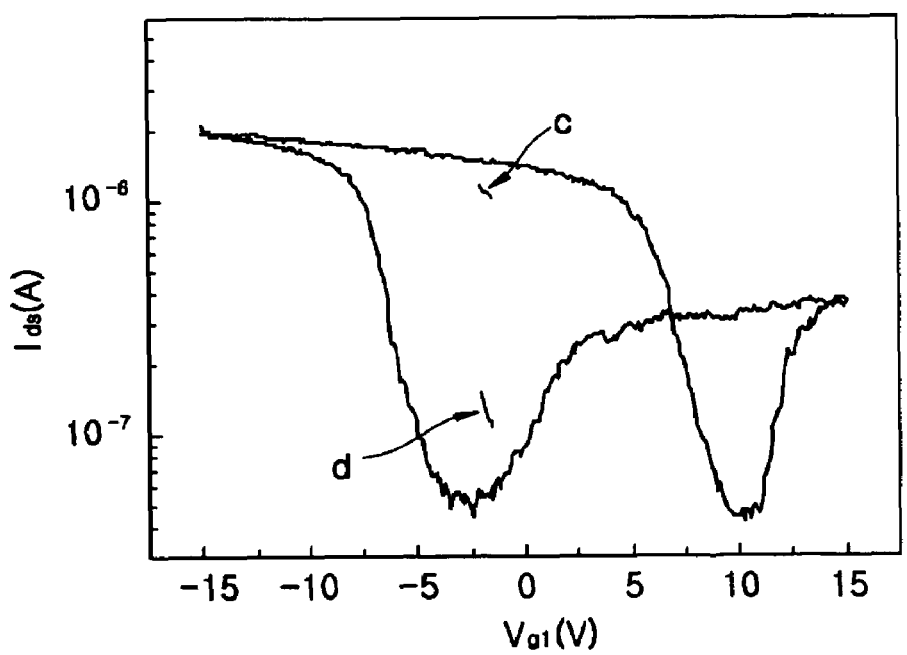
FIG. 5 is a graph of a voltage-current characteristic illustrating experimental results of a writing and erasing operation experiment using a lower gate electrode of a multi-bit nonvolatile memory device according to one or more example embodiments of the present invention.

FIG. 5 is a graph of voltage-current characteristics showing illustrating an experimental result of an experiment conducted using the lower gate electrode 110 of the multi-bit nonvolatile memory device 100 of FIG. 1. In FIG. 5, "c" indicates the result of performing a reading operation after a pulse voltage of −15V is applied to $V_{g1}$ for one second, and "d" indicates the result of performing a reading operation after a pulse voltage of −20V is applied to $V_{g1}$ for one second. In this example, the reading operation is performed by applying −2V to $V_{g1}$ and 300 mV to $V_{DS}$.

As a result of repeatedly applying a negative pulse voltage to $V_{g1}$, the voltage-current characteristic may be changed. For example, a current may transition from a higher value of the voltage-current hysteresis to a lower value at the read voltage. A two-bit memory operation may be achieved by recognizing state "c" as a writing state and stage "d" as an erasing state. Although only example states "c" and "d" are discussed herein for the sake of brevity, multi-bit operations with more than two bits may be realized by applying a further divided pulse.

Figure 6:
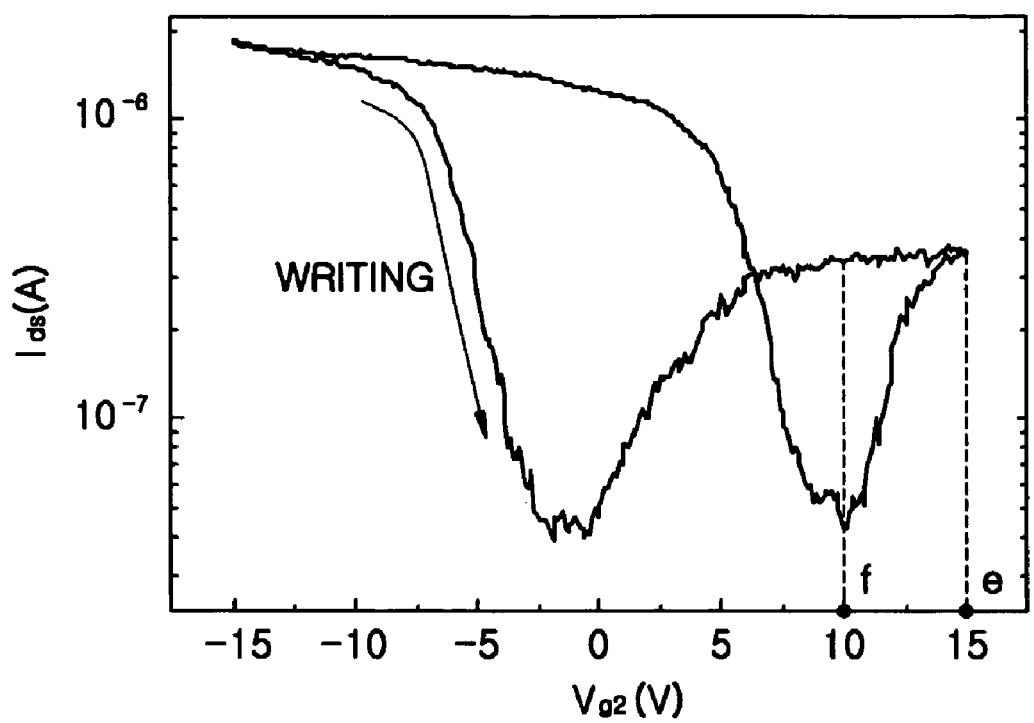
FIG. 6 is a graph of a voltage-current characteristic illustrating example writing and erasing operations of an upper gate electrode of a multi-bit nonvolatile memory device according to one or more example embodiments of the present invention.

FIG. 6 is a graph of voltage-current characteristics illustrating example writing and erasing operations of an upper gate electrode using a second storage node of a multi-bit nonvolatile memory device according to an example embodiment of the present invention. For example purposes, FIG. 6 will be described with regard to the multi-bit nonvolatile memory device 100 of FIG. 1. A writing operation with respect to the second storage node 160 may be performed by applying a zero voltage to $V_{DS}$ of FIG. 2 in order to ground the source 140 and the drain 150. A write voltage may be applied to $V_{g2}$ to perform a writing operation.

The write voltage may be a positive voltage or a sweeping voltage that may sweep from a negative voltage to a positive voltage. For example, the write voltage may be a positive saturated current voltage equal to about 15V. The write voltage may be a pulse voltage. In another example, the write voltage may be a sweeping voltage that may sweep from about −15V to about 15V.

To perform an erasing operation, a zero voltage may be applied to $V_{DS}$ to ground the source 140 and the drain 150, and an erase voltage may be applied to $V_{g2}$ to perform an erasing operation. The erase voltage may be a positive voltage. For example, the erase voltage may be a positive saturated current voltage equal to about 15V. The erase voltage may be a pulse voltage.

To perform a reading operation, a first read voltage may be applied to $V_{DS}$ and a second read voltage may be applied to $V_{g2}$. The first read voltage may be a positive voltage that may induce an appropriate voltage difference between the source 140 and the drain 150. The first read voltage may be selected by those skilled in the art. For example, the first read voltage may be about 300 mV.

The second read voltage may be a voltage distinguishing a writing state from an erasing state. In at least one example embodiment of the present invention, the second read voltage must be a voltage distinguishing a writing state from an erasing state. A voltage "f" at which a current difference between the writing state and the erasing state is larger (e.g., the largest) may be the second read voltage. In one example, the second read voltage may be about 10V.

In a manner similar or substantially similar to that described above with regard to FIG. 5, the two-bit memory operation corresponding to a writing state and an erasing state may be realized when a positive voltage, such as a pulse type voltage, is applied to $V_{g2}$ and the reading operation is performed, for example, repeatedly. Although example embodiments of the present invention have been described with regard to two-bit memory operation, a multi-bit memory operation using two or more bits may be realized by applying a further divided pulse voltage.

Memory devices according to one or more example embodiments of the present invention may be included in a cell array. A cell array may include a plurality of cell units, at least one of which may include a memory device, for example, memory device 100 of FIG. 1.

As described above, the use of the multi-bit nonvolatile memory device, according to example embodiments of the present invention, in which voltages having different polarities are applied to the gate electrodes, respectively, may enable a bi-polar multi-bit memory operation. However, the operations of lower gate electrodes and upper gate electrodes, according to example embodiments of the present invention, are for example purposes only, and the polarities of the gate electrodes may be reversed. For example, the descriptions with respect to FIGS. 4 and 5 may be applied to the upper gate electrode 170, and also, the descriptions with respect to FIG. 6 may be applied to the lower gate electrode 110. Furthermore, both the lower gate electrode 110 and the upper gate electrode 170 may be operated identically or substantially identically, as shown in the descriptions with respect to FIGS. 4, 5 and/or 6.

While example embodiments of the present invention have been shown and described with reference to the drawings, it will be understood by those of ordinary skill in the art that various changes in form and details may be made therein without departing from the spirit and scope of the present invention as defined by the following claims.

What is claimed is:

1. A memory device comprising:
    a channel formed of at least one carbon nanotube;
    a source and a drain arranged at respective ends of the channel, the source and drain contacting terminal ends of the carbon nanotube;
    a first storage node formed under the channel;
    a second storage node formed on the channel;
    a first gate electrode formed under the first storage node; and
    a second gate electrode formed on the second storage node,
    wherein the memory device is configured to write and erase using Fowler-Nordheim tunneling.

2. The memory device of claim 1, wherein at least one of the first and second storage nodes has a stack structure.

3. The memory device of claim 2, wherein the stack structure includes at least one silicon oxide film and at least one silicon nitride film stacked alternately.

4. The memory device of claim 2, wherein the stack structure includes two silicon oxide films with a silicon nitride film interposed there between.

5. The memory device of claim 2, wherein the stack structure includes a silicon oxide film, a high K insulating film having a larger dielectric constant than the silicon oxide film and a silicon oxide film stacked alternately.

6. The memory device of claim 1, wherein at least one of the first and second storage nodes is formed of embedded nano-crystals.

7. The memory device of claim 6, wherein the nano-crystals are formed of metal dots or silicon dots.

8. The memory device of claim 1, wherein at least one of the first and second storage nodes are formed of polymers or biomaterials.

9. The memory device of claim 1, wherein the source and the drain are formed of a metal or metal alloy.

10. The memory device of claim 9, wherein the metal includes at least Au.

11. The memory device of claim 1, wherein the first gate electrode is formed of silicon doped with a dopant.

12. The memory device of claim 11, wherein the dopant is a p-type dopant.

13. The memory device of claim 1, wherein the channel is formed of a single-walled carbon nanotube.

14. The memory device of claim 1, wherein the channel is formed of a double-walled carbon nanotube.

15. The memory device of claim 1, wherein the channel is formed of a plurality of carbon nanotubes in parallel.

16. The memory device of claim 1, wherein the channel is formed of a bundle of a plurality of carbon nanotubes.

17. A cell array including a plurality of cell units, each cell unit comprising:
at least one memory device as claimed in claim 1.

18. A method of operating the memory device of claim 1, the method comprising:
performing at least one of a writing operation, an erasing operation and a reading operation; wherein
the writing operation is performed by applying a write voltage to one of the gate electrodes after grounding the source and the drain,
the erasing operation is performed by applying an erase voltage to one of the gate electrodes after grounding the source and the drain, and
the reading operation is performed by applying a first read voltage between the source and the drain while applying a second read voltage to one of the gate electrodes.

19. The method of claim 18, wherein the write voltage applied to the first gate electrode is a negative voltage or a sweeping voltage that sweeps from a positive voltage to a negative voltage.

20. The method of claim 18, wherein the write voltage applied to the first gate electrode is about −15V or a sweeping voltage that sweeps from about 15V to about −15V.

21. The method of claim 18, wherein the write voltage applied to the second gate electrode is a positive voltage or a sweeping voltage that sweeps from a negative voltage to a positive voltage.

22. The method of claim 18, wherein the write voltage applied to the second gate electrode is about 15V or a sweeping voltage that sweeps from about −15V to about 15V.

23. The method of claim 18, wherein the erase voltage applied to the first gate electrode is a negative voltage.

24. The method of claim 18, wherein the erase voltage applied to the first gate electrode is about −15V.

25. The method of claim 18, wherein the erase voltage applied to the second gate electrode is a positive voltage.

26. The method of claim 18, wherein the erase voltage applied to the second gate electrode is about 15V.

27. The method of claim 18, wherein the second read voltage applied to the first gate electrode is a negative voltage.

28. The method of claim 18, wherein the second read voltage applied to the first gate electrode is about −2V.

29. The method of claim 18, wherein the second read voltage applied to the second gate electrode is a positive voltage.

30. The method of claim 18, wherein the second read voltage applied to the second gate electrode is about 10V.

31. The method of claim 18, wherein the first read voltage is about 300 mV.

32. A memory device comprising:
a channel formed of at least one carbon nanotube;
a source and a drain arranged at respective ends of the channel, the source and drain contacting at least a portion of a respective end of the carbon nanotube;
a first storage node formed under the channel;
a second storage node formed on the channel;
a first gate electrode formed under the first storage node; and
a second gate electrode formed on the second storage node, a first lateral gap between the second gate electrode and the source, and a second lateral gap between the second gate electrode and the drain,
wherein the memory device is configured to write and erase using Fowler-Nordheim tunneling.

* * * * *